(12) United States Patent
Grottenmüller et al.

(10) Patent No.: US 10,385,234 B2
(45) Date of Patent: Aug. 20, 2019

(54) HYBRID MATERIAL FOR USE AS COATING MEANS IN OPTOELECTRONIC COMPONENTS

(71) Applicant: AZ ELECTRONIC MATERIALS (LUXEMBOURG) S.Á.R.L., Luxembourg (LU)

(72) Inventors: Ralf Grottenmüller, Wiesbaden (DE); Rosalin Karunanandan, Frankfurt am Main (DE); Fumio Kita, Wiesbaden (DE); Helmut Lenz, Eschborn (DE); Dieter Wagner, Wiesbaden (DE); Andreas Dresel, Hünstetten (DE)

(73) Assignee: AZ Electronics Materials (LUXEMBOURG) S.Á.R.L., Luxembourg (LU)

( * ) Notice: Subject to any disclaimer, the term of this patent is extended or adjusted under 35 U.S.C. 154(b) by 26 days.

(21) Appl. No.: 15/329,311

(22) PCT Filed: Jul. 28, 2015

(86) PCT No.: PCT/EP2015/067304
§ 371 (c)(1),
(2) Date: Jan. 26, 2017

(87) PCT Pub. No.: WO2016/016260
PCT Pub. Date: Feb. 4, 2016

(65) Prior Publication Data
US 2017/0210944 A1 Jul. 27, 2017

(30) Foreign Application Priority Data
Jul. 29, 2014 (EP) ..................... 14178994

(51) Int. Cl.
| | | |
|---|---|---|
| C09D 183/16 | (2006.01) | |
| C09D 7/62 | (2018.01) | |
| C08G 77/62 | (2006.01) | |
| C08L 83/16 | (2006.01) | |
| C08K 9/04 | (2006.01) | |
| H01L 23/29 | (2006.01) | |
| C09D 7/40 | (2018.01) | |
| C09D 5/22 | (2006.01) | |
| C09K 11/00 | (2006.01) | |
| H01L 33/50 | (2010.01) | |
| H01L 33/56 | (2010.01) | |
| C08K 3/013 | (2018.01) | |
| C08K 3/20 | (2006.01) | |
| C08K 5/00 | (2006.01) | |
| C08K 9/06 | (2006.01) | |

(52) U.S. Cl.
CPC .......... *C09D 183/16* (2013.01); *C08G 77/62* (2013.01); *C08K 9/04* (2013.01); *C08L 83/16* (2013.01); *C09D 5/22* (2013.01); *C09D 7/62* (2018.01); *C09D 7/67* (2018.01); *C09K 11/00* (2013.01); *H01L 23/293* (2013.01); *H01L 33/502* (2013.01); *H01L 33/56* (2013.01); *C08K 3/013* (2018.01); *C08K 3/20* (2013.01); *C08K 5/0008* (2013.01); *C08K 9/06* (2013.01); *C08K 2201/003* (2013.01); *C08K 2201/011* (2013.01); *H01L 2924/0002* (2013.01); *H01L 2933/005* (2013.01); *H01L 2933/0041* (2013.01)

(58) Field of Classification Search
None
See application file for complete search history.

(56) References Cited

U.S. PATENT DOCUMENTS

| | | | | |
|---|---|---|---|---|
| 4,678,688 A * | 7/1987 | Itoh | ........................ | C08G 77/54 427/387 |
| 5,112,885 A * | 5/1992 | Inoue | ...................... | C08L 83/04 523/212 |
| 5,288,795 A * | 2/1994 | Fujiki | ...................... | C08L 83/04 524/731 |
| 5,364,920 A | 11/1994 | Bujalski et al. | | |
| 6,204,523 B1 | 3/2001 | Carey et al. | | |
| 6,274,924 B1 | 8/2001 | Carey et al. | | |
| 6,329,487 B1 | 12/2001 | Abel et al. | | |
| 6,501,014 B1 | 12/2002 | Kubota et al. | | |
| 8,153,199 B2 | 4/2012 | Brand et al. | | |
| 8,309,228 B2 | 11/2012 | Dierdorf et al. | | |
| 8,470,924 B2 | 6/2013 | Brand et al. | | |
| 9,234,119 B2 | 1/2016 | Rode et al. | | |
| 2002/0165319 A1* | 11/2002 | Knasiak | ................. | C08G 77/42 525/100 |
| 2006/0106156 A1* | 5/2006 | Woerner | .............. | C08K 5/5406 524/588 |
| 2007/0116976 A1* | 5/2007 | Tan | ........................ | B82Y 30/00 428/546 |

(Continued)

FOREIGN PATENT DOCUMENTS

| | | |
|---|---|---|
| CN | 101654778 | 2/2010 |
| EP | 0389084 A2 | 9/1990 |

(Continued)

OTHER PUBLICATIONS

Selective crosslinking of oligosilazanes, J.Mater. Chem.A, Jan. 2013, 15406.*

(Continued)

*Primary Examiner* — Peter A Salamon
(74) *Attorney, Agent, or Firm* — Drinker Biddle & Reath LLP

(57) ABSTRACT

The invention relates to the use of a hybrid material comprising
a) an organopolysilazane material and
b) at least one surface-modified nanoscale inorganic oxide
as coating material for producing transparent layers having a thickness of less than 500 μm in optoelectronic components.

19 Claims, No Drawings

(56) References Cited

U.S. PATENT DOCUMENTS

| | | | |
|---|---|---|---|
| 2007/0190308 A1* | 8/2007 | Brand | B05D 5/00 428/323 |
| 2008/0107894 A1 | 5/2008 | Brand et al. | |
| 2008/0200609 A1* | 8/2008 | Woerner | C08L 83/04 524/588 |
| 2009/0112013 A1 | 4/2009 | Nakazawa et al. | |
| 2010/0166977 A1* | 7/2010 | Brand et al. | C08J 7/047 427/515 |
| 2011/0166288 A1* | 7/2011 | Woerner | C08L 83/04 524/547 |
| 2012/0017985 A1 | 1/2012 | Rode et al. | |
| 2012/0088845 A1 | 4/2012 | Williams et al. | |
| 2015/0249166 A1 | 9/2015 | Iitsuka et al. | |

FOREIGN PATENT DOCUMENTS

| | | |
|---|---|---|
| JP | H-07223867 A | 8/1995 |
| JP | 2003-050385 A | 2/2003 |
| JP | 2003050385 A * | 2/2003 |
| JP | 2003347294 A | 12/2003 |
| JP | 2006219538 A | 8/2006 |
| KR | 2014-0068547 A | 6/2014 |
| WO | 2005-085375 A1 | 9/2005 |
| WO | 2006-056285 A1 | 6/2006 |
| WO | 2007-012392 A2 | 2/2007 |
| WO | 2007-028511 A2 | 3/2007 |
| WO | 2007-096070 A1 | 8/2007 |
| WO | 2008-138610 A1 | 11/2008 |
| WO | 2010-105796 A1 | 9/2010 |
| WO | 2014-050769 A1 | 4/2014 |

OTHER PUBLICATIONS

J. Schwark, Mat.Res.Soc.Symp.Proc., 271, 1992, 807-812.
L. Rosenberg, J.Am.Chem.Soc. 123/21, 2001, 5120-5121.
Y. Corey, Adv. In Organometallic Chem., 51, 2004, 1-52.
O. Flores, J. Mater. Chem A, Jan. 2013, 15406.
International Search Report, dated Feb. 4, 2016 for PCT/EP2015/067304, which corresponds to U.S. Appl. No. 15/329,311.

* cited by examiner

HYBRID MATERIAL FOR USE AS COATING MEANS IN OPTOELECTRONIC COMPONENTS

CROSS-REFERENCE TO RELATED APPLICATIONS

The present application is a U.S. National Stage Application of International Application No. PCT/EP2015/067304, filing date Jul. 28, 2015, which claims the benefit of priority of European Patent Application No. 14178994.1, filing date Jul. 29, 2014, each of which is incorporated by reference herein in its entirety.

The invention relates to the use of specific organopolysilazane hybrid materials as coatings in optoelectronic components, to methods of coating substrates with the specific hybrid materials and to optoelectronic components coated with the hybrid materials.

Polysilazanes have been known for years to be useful as coatings for various uses.

There are some uses, for example in solar cells (WO 2010/105 796 and WO 2010/105 798), as corrosion control layers (WO 2007/096 070) or as gas barrier layers (WO 2007/012 392), where the polysilazanes are coated and thereafter fired to form ceramic coatings based on $SiO_2$.

There are other uses, for example as coatings for metallic and polymeric surfaces (WO 2007/028 511), as self-cleaning protective layers particularly for automotive rims (WO 2005/085 375), for coating metal strips (WO 2006/050 813), for coating foils and films (WO 2006/056 285) or in paints (WO 2008/138 610), where the polysilazane layers are cured after application, but the structure of the polysilazane is essentially preserved.

The cited documents all describe the option of adding nanoparticles of inorganic oxides to the organopolysilazane.

JP-A 2003 050 385 discloses a coating for a liquid-crystal cell which may be obtained on the basis of a polysilazane which comprises surface-modified ferroelectric particles. This polysilazane is fired to a ceramic material.

KR-A 2014 0068547 discloses $SiO_2$ films which are produced from perhydro-polysilazane and inorganic, surface-modified particles and are used in electroluminescent devices.

WO 2013/046 662 discloses an LED which comprises a ceramic layer composed of a fluorescent material and inorganic oxide particles, it being possible for the ceramic layer to be obtained from polysilazanes.

It has now been found that certain hybrid materials comprising organopolysilazanes and oxidic inorganic nanoparticles are particularly suitable for producing coatings in optoelectronic components.

The invention accordingly provides for the use of a hybrid material comprising
a) an organopolysilazane material and
b) at least one surface-modified nanoscale inorganic oxide
as coating material for producing transparent layers having a thickness of less than 500 μm in optoelectronic components.

The invention further provides a method of applying a transparent layer having a thickness of <500 μm in an optoelectronic component, wherein
I) a hybrid material according to the invention is applied to a surface in the optoelectronic component,
II) dried, and
III) optionally cured.

The use of the hybrid materials used according to the invention offers various advantages. They are characterized by defect-free coatings without cracking of layers having a layer thickness of up to 500 μm at temperatures up to 200° C. Coatings according to the invention preferably have a uniform layer thickness having a layer thickness variation relative to the average layer thickness of <5% for an absolute layer thickness of 0.1 μm to 500 μm.

Coatings according to the invention are notable for a high refractive index and have unchanging absorption characteristics.

Coatings obtained according to the invention preferably have a low weight loss of ≤10%, preferably ≤5%, on curing at a comparatively high temperature of up to 200° C.

The organopolysilazanes used according to the invention preferably comprise repeat units of formula (I)

$$-[SiRR'-NH]-\qquad(I)$$

where
R and R' are the same or different and are each H, methyl, ethyl, straight-chain or branched $C_3$-$C_8$ alkyl, $C_3$-$C_8$ cycloalkyl, $C_2$-$C_6$ alkenyl or aryl
with the proviso that R and R' may not both be H.

Preference is given to organopolysilazanes of formula (I) where
R and R' are the same or different and are each H, methyl, ethyl, straight-chain, branched or cyclic $C_3$-$C_8$ alkyl, phenyl, vinyl or aryl.

Particular preference is given to organopolysilazanes of formula (I) where
R and R' are the same or different and are each H, methyl, ethyl, n-propyl, isopropyl, n-butyl, isobutyl, phenyl or vinyl.

Very particular preference is given to organopolysilazanes of formula (I) where R and R' are the same or different and are each H, methyl or vinyl.

Especial preference is given to organopolysilazanes of formula (I) where R and R' are the same or different and are each H or methyl.

Preference is further given to organopolysilazanes of formula (I) where at least 20% of the repeat units of formula (I) have at least one intramolecular crosslink, and/or
where the polysilazane has an average molar weight $M_w$ in the range from 3000 to 100 000 g/mol, and/or
where the fraction of the polysilazane which is in the molar weight range of less than 1000 g/mol is less than 10 wt %.

The polysilazanes used according to the invention may be liquid or solid and, in the case of the latter, amorphous or crystalline.

The structure indicated by the repeat units of formula (I) for the polysilazanes used according to the invention corresponds to a simplified depiction on the basis of the monomers used. A person skilled in the art will know that the structure of the polysilazanes is not just linear, but consists overwhelmingly of discrete and/or fused ring and also three-dimensional scaffolding structures. The polymers thus comprise not only "secondary" nitrogen atoms in relation to silicon (in —Si—NR—Si— groups) but also "tertiary" (Si—N(—Si)—Si) and primary ($NR_2$—Si) ones. Correspondingly, the silicon atoms may comprise not just "secondary" groups in relation to nitrogen (N—$SiR_2$—N) but also "tertiary" $N_3SiR$ and "primary" N—$SiR_3$ groups. The precise structure may be dependent, for example, on the method of synthesis and the nature of the R radicals.

In one particularly preferred embodiment, the polysilazane comprises repeat units of formula (II)

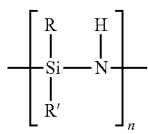

(II)

where R and R' are each as defined above and n is an integer chosen so as to provide a weight-average molar weight in the range from 3000 to 100 000 g/mol.

In a further preferred embodiment, the polysilazane comprises repeat units of formula (III)

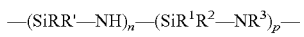

—(SiRR'—NH)$_n$—(SiR$^1$R$^2$—NR$^3$)$_p$—  (III)

where
R and R' are each as defined above,
R$^1$ and R$^2$ are the same or different and are each H, C$_1$-C$_8$ alkyl, C$_3$-C$_8$ cycloalkyl, C$_2$-C$_3$ alkenyl or phenyl, and
R$^3$ is H, C$_1$-C$_8$ alkyl or C$_3$-C$_8$ cycloalkyl,
with the proviso that at least one of the radicals R$^1$, R$^2$ and R$^3$ differs from the corresponding radicals R and R',
and where n and p are each integers chosen so as to provide a weight-average molar weight in the range from 3000 to 100 000 g/mol.

In a further preferred embodiment, the polysilazane comprises repeat units of formula (IV)

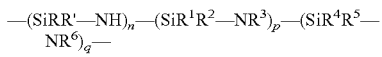

—(SiRR'—NH)$_n$—(SiR$^1$R$^2$—NR$^3$)$_p$—(SiR$^4$R$^5$—NR$^6$)$_q$—  (IV)

where
R and R' are each as defined above,
R$^1$, R$^2$, R$^4$ and R$^5$ are the same or different and are each H, C$_1$-C$_8$ alkyl, C$_3$-C$_8$ cycloalkyl, C$_2$-C$_3$ alkenyl or phenyl, and
R$^3$ and R$^6$ are each H, C$_1$-C$_8$ alkyl or C$_3$-C$_8$ cycloalkyl,
with the proviso that the three repeat units are different in at least one of the radicals, and where n, p and q are each integers chosen so as to provide a weight-average molar weight in the range from 3000 to 100 000 g/mol.

At least 20% of the repeat units of formula (I) in the polysilazanes used according to the invention preferably have at least one intramolecular crosslink.

The polysilazanes used according to the invention preferably have an average molar weight M$_w$ in the range from 3000 to 100 000 g/mol, particularly preferably an average molar weight M$_w$ in the range from 3000 to 20 000 g/mol.

It is particularly preferable for the fraction of the polysilazanes used according to the invention which is in the molar weight range of less than 1000 g/mol to be less than 10 wt %, more preferably less than 5 wt %.

Formula (I) repeat unit polysilazanes used according to the invention are known in principle (see, for example, the references cited at the beginning). In commercial practice, the polysilazanes are almost always synthesized by reaction of dichlorosilanes with ammonia according to general equation (I):

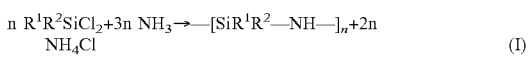

n R$^1$R$^2$SiCl$_2$+3n NH$_3$→—[SiR$^1$R$^2$—NH—]$_n$+2n NH$_4$Cl  (I)

Excess ammonia binds the liberated HCl as ammonium chloride. Varying the nature of the R radicals and/or combining various dichlorosilanes make it possible to produce either a perhydropolysilazane (PHPS) (exclusively SiH$_2$Cl$_2$) or discretionarily substituted organopolysilazanes (e.g. SiMe$_2$Cl$_2$ and SiMeHCl$_2$ for manufacturing the commercial product DURAZANE® 1033 or, respectively, Si(CH=CH$_2$) MeCl$_2$+SiMeHCl$_2$ for manufacturing the commercial product DURAZANE® 1800, both available from AZ Electronic Materials Germany GmbH, Wiesbaden, Germany).

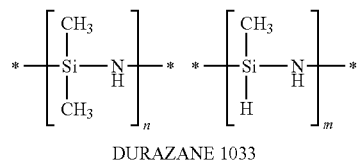

DURAZANE 1033

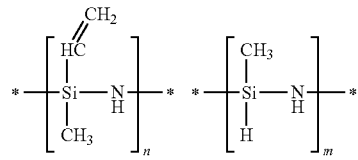

DURAZANE 1800

One way the synthesis may be carried out, for example, involves passing chlorosilane into an initial charge of liquid ammonia [e.g. U.S. Pat. No. 6,329,487 B1]. Alternatively, the initial charge may also be a solvent and chlorosilane and ammonia are passed into it at the same time or in succession in a suitable order [e.g. EP 0341924 A2].

A feature which is common to all the existing commercial syntheses is that the silazanes thus obtained are only relatively low molecular weight compounds. The reason is the pronounced tendency of silazanes to form rings and not, but to a minor extent, linear chains. Silazanes obtained by the abovementioned process are thus merely low molecular weight oligomers and not high molecular weight polymers. It is known that —[—Si(CH=CH$_2$)Me-NH—]$_n$—, for example, exists nearly exclusively in the form of 6 and 8 rings.

The problem, then, with the known commercially available polysilazanes is that when a coating is cured at comparatively high temperatures and particularly when it is converted into ceramics, which requires temperatures of up to over 1000° C., a considerable fraction of the material will vaporize during the cure. Possible consequences of this loss of material include uncontrollable unevennesses in the surface of thin layers and also a possible nonuniform shrinkage of the layer thickness, possibly resulting in cracking. The vaporized fraction additionally entails the problem that it recondenses on cold surfaces such as, for example, machinery parts and causes undesirable fouling which is difficult to get back off.

Employing postcrosslinked organopolysilazanes is preferable in the present invention.

Methods of postcrosslinking silazanes, i.e. methods of producing the polysilazanes used according to the invention, are already known, but they predominantly have certain disadvantages.

Silazanes are in principle crosslinkable by adding catalytic amounts of strong bases. Possibilities include, for example, alkyl-lithium or alkyl-sodium compounds [D. Seyferth, Organometallics, 8, 1989, 1980-1986]. EP 0342924 A2 describes the aftertreatment of —[SiHMe-NH]n- in a THF solution by adding catalytic amounts of potassium hydride. To neutralize the base, it is subsequently necessary to add dimethylchlorosilane (SiMe$_2$HCl), which results in the formation of —SiMe$_2$H side chains and the liberation of KCl. In U.S. Pat. No. 4,720,532, oligomeric silazane is likewise converted by KH in an inert solvent, although the degree of crosslinking is very difficult to police, since absent the addition of a neutralizing reagent the reaction proceeds all the way to gel formation.

U.S. Pat. No. 6,329,487 B1 describes a method of post-crosslinking Si—H and N—H groups in polysilazanes to form Si—N bonds by hydrogen elimination catalyzed by ammonium chloride according to a specific mechanism described in said document. Liquid ammonia is needed as solvent, and the solvated ammonium cation therein is the actual catalytically active species. This method is limited to liquid ammonia as solvent. However, the handling of liquid ammonia particularly on a comparatively large scale is very costly and inconvenient, which is a significant obstacle to the industrial practice of this method.

KION Corp. [J. Schwark, Mat. Res. Soc. Symp. Proc., 271, 1992, 807-812] describes the crosslinking by bisisocyanates. The reaction of silazenes with isocyanates proceeds as described in equation (II) by way of example:

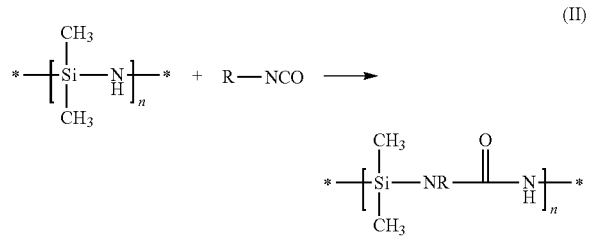

The disadvantage of this method is the unavoidable incorporation of urea bonds in the main chain, so it is no longer a pure polysilazane which is concerned.

L. Rosenberg [J. Am. Chem. Soc. 123/21, 2001, 5120-5121] and J.Y. Corey [Adv. In Organometallic Chem., 51, 2004, 1-52] describe the coupling of silanes by hydrogen elimination catalyzed by various metal complexes according to:

$$2\ R_3Si—H \rightarrow R_3Si—SiR_3 + H_2$$

The catalysts mentioned include Wilkinson's catalyst [(PH$_3$P)$_3$RhCl] and dimethyltitanocene [Cp$_2$TiMe$_2$]. However, the examples mentioned are restricted to defined low molecular weight molecules. It is doubtful whether comparatively high molecular weight polysilazanes also react in a controlled manner in this fashion.

It is further known to crosslink by incorporating boron-containing bridges. EP 0389084 A2 describes, for example, the crosslinking of Si—H functional polysilazanes with BCl$_3$ or B(OMe)$_3$, while U.S. Pat. No. 5,364,920 describes the crosslinking of B-H functional crosslinkers. These methods necessarily result in some incorporation of boron, but this is only sensible when silicon-boron nitride-type ceramics are to be produced in any case. In most cases, however, any impurification with boron is undesired.

US 2009/0112013 A1 describes the coupling of silanes and siloxanes by hydrogen elimination on irradiation with UV light in the presence of the iron catalyst CpDe(CO)$_2$Me according to 2 R$_3$Si—H→R$_3$Si—SiR$_3$+H$_2$. No information is provided as to whether H-functional silazanes react as well as the silanes and siloxanes described. In addition, the examples mentioned in the literature are limited to well-defined low molecular weight molecules.

It was found that a crosslinking reaction of polysilazanes comprising N—H and SiH bonds represents, via the catalytic action of fluoride ions as per equation (III) below, a simple-to-perform and readily controllable reaction for preparing the polysilazanes used according to the invention, i.e. the molar weight of oligomeric silazanes is increased and thereby vaporization during high-temperature curing is prevented and the coating properties are improved:

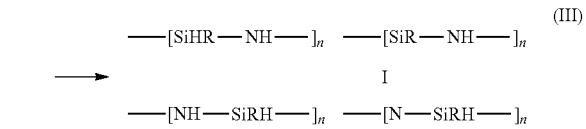

J. Mater. Chem A, 2013, 1, 15406 and WO 2014/328 174 describe the crosslinking of oligosilazanes using fluoride catalysis.

The fluoride ion is the catalytically active species in this reaction. The nature of the counter-ion and the reaction conditions are routinely chosen so as to ensure sufficient solubility for F$^-$. Suitable sources of fluoride are preferably salts from the group of alkali metal fluorides, NH$_x$R$_y$F where x is from 0 to 4 and y is 4-x, or resin-bound fluorides.

Examples of such salts include CsF, NH$_4$F and tetraalkylammonium fluorides such as N(CH$_3$)$_4$F, N(C$_2$H$_5$)$_4$F and N(n-C$_4$H$_9$)$_4$F. Tetraalkylammonium fluorides having mixed R groups, such as dodecyltrimethylammonium fluoride, are likewise possible. Further possibilities include arylammonium fluorides, such as benzyltrimethylammonium fluoride.

The combination of solvent polarity and reaction temperature may routinely be chosen such that the reaction is self-stopping after a certain degree of conversion. This makes it possible to adjust the degree of crosslinking in an intentional manner. The reaction mixture may be cooled down and an apolar solvent such as n-heptane or t-butyl methyl ether added to fully precipitate the fluoride salt and filter it off. Fluoride may also be removed by addition of salts such as LiBr, for example, which form sparingly soluble fluorides and thereby precipitate the fluoride. The polysilazane thus obtained meets the conditions for the polysilazanes to be used according to the invention and may be isolated or left in solution for employment as coating according to the invention.

Organopolysilazanes crosslinked by fluoride catalysis in the manner of the invention preferably have a viscosity of >5000 mP·s or are solids. Viscosity is determined with a Brookfield Rheometer R/S plus, Brookfield cone-type spindle RC3-50-1 at a speed of 3 rpm at 25° C.

Preference is thus given to the use of organopolysilazanes, in particular those of formula (I) comprising NH and SiH bonds which were crosslinked by catalytic action of fluoride ions. Preference is thus given to a method of producing polysilazanes used according to the invention and the hybrid material obtained therefrom, wherein one or more organopolysilazanes, preferably those of formula (I) and preferably having average molar weights M$_w$ of less than 3000 g/mol, are crosslinked by treatment with a fluoride catalyst and then admixed with the surface-modified nanoscale inorganic oxide.

Component b) of the hybrid material consists of one or more types of inorganic oxidic nanoparticles (i.e. nanoscale inorganic oxide) having an average diameter in the range from 1 to 30 nm, preferably from 3 to 20 nm.

Average diameter is measured by scattering dynamic light at the dispersed nanoparticles, preferably by using a MALVERN Zetasizer Nano Z, with a wavelength of 633 nm.

In one preferred embodiment, the refractive index of the inorganic nanoparticles is in the range from 1.40 to 3.00, preferably from 1.4 to 2.50 and more preferably from 1.40 to 2.30.

The nanoparticles are selected from metal oxide nanoparticles.

The inorganic nanoparticles are preferably selected from the group of metal oxide nanoparticles comprising oxides of a metal selected from silicon (Si), titanium (Ti), cobalt (Co), tin (Sn), aluminium (Al), zinc (Zn), indium (In), zirconium (Zr), nickel (Ni), hafnium (Hf), vanadium (V) or a combination comprising at least two of the aforementioned metal oxides. More preferable nanoparticles are selected from $Al_2O_3$, $SiO_2$, $ZrO_2$ and $TiO_2$, particularly $SiO_2$, $TiO_2$ and $ZrO_2$ and most preferably from $SiO_2$ and $ZrO_2$.

Suitable inorganic particles are essentially non-absorbing across the spectral bandwidth of the emission LED and the emission of the wavelength converter. Particle size and density can be chosen so as to achieve the desired degrees of transmission and scattering.

The inorganic nanoparticles are surface modified in order to promote uniform dispersal in the hybrid material. To ensure that the nanoparticles are compatible with the various solvent or dispersant media and with the polymer matrix and to prevent aggregation, the nanoparticle surface has to be protected. Surface protection further has the purpose to provide additional functionalities, for example double bonds, to the nanoparticles.

Typical compounds for modifying the surface of nanoparticles are organosilanes, organic amines, organic thiols, organic alcohols, trialkylphosphines, carboxylic acids, phosphonic acids, phosphorous acid, zirconates, titanates. Organosilanes are a known class of organic compounds used for protecting the surface of oxidic nanoparticles. Organosilanes typically have a reactive moiety and a non-reactive moiety. The reactive moiety of the organosilane is typically either a trialkoxysilane group, a monoalkoxysilane group or a trichlorosilane group, although disubstituted alkoxy- and di- and monosubstituted chlorosilanes are likewise possible. The reactive group bonds the oxide covalently to the hydroxyl group or the —OR group where an alkyl or aryl group is present in R. The non-reactive moiety of the organosilane may comprise one or more alkyl chains of differing chain length, one or more than one cyclic alkyl group of differing chain length, fluorinated alkyl groups, alkenyl groups, epoxy groups, aryl groups, ether groups, amines, thiols or carboxylic acids. Organosilanes generally have the structure $R_aSi(OR')_b$, where a is 1, 2 or 3, b is 4-a, and R and R' are each organic radicals with R' preferably being methyl, ethyl, n-propyl, isopropyl, n-butyl or isobutyl. In one preferred mode, the surface-modifying compound is a trialkoxysilane or a trichlorosilane wherein, in either case, a $C_1$-$C_{18}$ alkyl or $C_2$-$C_{18}$ alkenyl group attaches to the silicon atom. Preferable are $C_1$-$C_6$ alkyl groups or $C_2$-$C_6$ alkenyl groups, more preferable are $C_1$-$C_3$ alkyl or $C_2$-$C_3$ alkenyl, especially vinyl and allyl.

Examples of organosilanes include methyltrimethoxysilane, methyltriethoxysilane, trimethylmethoxysilane, trimethylethoxysilane, n-propyltrimethoxysilane, n-propyltriethoxysilane, isobutyltrimethoxysilane, n-hexyltrimethoxysilane, n-octyltrimethoxysilane, n-octyltriethoxysilane, 1,2-bis(trimethoxysilyl)decane, phenyltrimethoxysilane, 4-phenylbutyltrimethoxysilane, acetoxymethyltrimethoxysilane, acetoxyethyltriethoxysilane, hydroxymethyltriethoxysilanes, hydroxy(polyethyleneoxy)propyltriethoxysilanes, 2-methoxy(polyethyleneoxy)propyltrimethoxysilane, methoxy(triethyleneoxy)propyltrimethoxysilane, 3-aminopropyltrimethoxysilane, p-aminophenyltrimethoxysilane, 3-mercaptopropyltrimethoxysilane, 3-(methacryloyloxy)propyltrimethoxysilane, vinyltrimethoxysilane, vinyltriethoxysilane, allyltrimethoxysilane, 3-isocyanatopropyltrimethoxysilane, 3-isocyanatopropyltriethoxysilane, glycidyloxypropyltrimethoxysilane, 2-(3,4-epoxycyclohexyl)ethyltrimethoxysilane, 3,3,3-trifluoropropyltrimethoxysilane and nonafluorohexyltrimethoxysilane. Methyltrimethoxysilane, propyltrimethoxysilane, vinyltrimethoxysilane and trimethylmethoxysilane are particularly preferable.

Preference for the surface treatment is given to alkoxysilanes of formula (V)

$$R''_n Si(OR''')_m \qquad (V)$$

where
n is 1, 2 or 3 and m is 4-n;
R" is methyl, ethyl, linear, branched or cyclic alkyl, of 3-8 carbon atoms, phenyl or $C_2$-$C_6$ alkenyl; and
R'" is methyl, ethyl, n-propyl, isopropyl, n-butyl or isobutyl.

Preference is given to alkoxysilanes of formula (V) where
n is 1 or 3 and m is 4-n;
R" is methyl, ethyl, linear or branched $C_3$-$C_8$ alkyl, phenyl or vinyl; and
R'" is methyl or ethyl.

Particular preference is given to alkoxysilanes of formula (V) where
n is 1 or 3 and m is 4-n;
R" is methyl, ethyl or linear or branched $C_3$-$C_8$ alkyl; and
R'" is methyl or ethyl.

The groups R" and R'" are each independently the same or different. Preferably, all the R" groups in a compound and independently all the R'" groups in a compound are the same.

Preference is given to hybrid materials according to the invention wherein the surface-modifying compound is an alkoxysilane of formula (V), a preferable or particularly preferable embodiment thereof or a mixture thereof.

Other classes of organic compounds used to modify an oxidic nanomaterial are carboxylic acids and alcohols. Examples of carboxylic acids include octanoic acid, acetic acid, propionic acid, 2-[2-(2-methoxyethoxy)ethoxy]acetic acid, benzoic acid, oleic acid and stearic acid.

Examples of alcohols include ethanol, propanol, butanol, hexanol, heptanol, octanol, benzyl alcohol, phenol, dodecyl alcohol, oleyl alcohol, octadecanol and triethylene glycol monomethyl ether.

The inorganic nanoparticles of the invention are preferably monodisperse. In one preferred embodiment, the amount of particles having a diameter of >20 nm is ≤10.0% by weight, the amount of particles having a diameter of >30 nm is ≤1.0% by weight, and the amount of particles having a diameter of >50 nm is ≤0.1%, where % is always to be understood as meaning wt %.

The distribution is determined by dynamic scattering of light at the dispersed nanoparticles using a MALVERN Zetasizer Nano Z instrument at a wavelength of 633 nm.

The hybrid material according to the invention is obtainable using the methods disclosed in US 2012/0088845.

In one embodiment, the organopolysilazane material is dissolved in a suitable solvent. In general, a dipolar protic solvent such as THF is admixed with a dispersion of the inorganic nanoparticles in a suitable solvent, for example an alkylated aromatic hydrocarbon such as toluene. The solvent is then removed, generally by distillation, and the crude product is optionally vacuum dried.

The amount of inorganic nanoparticles in the hybrid material is generally in the range from 1 to 85 wt %, preferably in the range from 10 to 75 wt % and more preferably in the range from 10 to 50 wt %.

Further constituents for the hybrid material employed according to the invention are optionally additives to for example positively influence the viscosity of the composition, wetting, filming or the vaporization behaviour. The hybrid material according to the invention may further comprise up to 10 wt % of one or more inorganic fillers other than the nanoparticles.

The hybrid material may comprise up to 60 wt % of converters, adhesion promoters and/or plasticizers.

To produce a mixture of the hybrid material with added substances, the components are generally dissolved or dispersed in a solvent or solvent mixture. The solvent is then removed, for example by distillation. Suitable solvents include, for example, polar or apolar aprotic solvents such as ethers, cyclic ethers, esters, e.g. THF or PGMEA, aromatic solvents such as toluene or alkanes such as heptane or cyclohexane.

The coating material according to the invention is described below.

The weight ratio of organopolysilazanes to surface-modified nanoparticles is in the range from 99:1 to 15:85 wt %.

In one preferred embodiment, polysilazanes used according to the invention are employed as such, i.e. without further dilution. Room temperature liquid materials are useful for such an application for example.

In a further preferred embodiment of the invention, the hybrid material employed according to the invention is applied as a coating in a solvent.

The fraction of hybrid material in the solvent is typically in the range from 1 to 90 wt % of polysilazane, preferably from 5 to 75 wt % and more preferably from 10 to 70 wt %.

Suitable solvents for the polysilazane composition include specifically inert (specifically hydroxyl- and amino-free) organic solvents. These include, for example, aliphatic or aromatic hydrocarbons, halogenated hydrocarbons, esters such as ethyl acetate or butyl acetate, ketones such as acetone or methyl ethyl ketone, ethers such as tetrahydrofuran, dioxane or dibutyl ether, and also mono- and polyalkylene glycol dialkyl ethers (glymes), or mixtures thereof.

The hybrid material according to the invention is useful as a coating for producing transparent layers having a layer thickness of less than 500 µm, preferably of 0.1 µm to 450 µm and more preferably of 0.3 µm to 250 µm. The layer thickness may be determined by methods known to those skilled in the art, as for example by mechanical, ultrasonic or optical measurements. Mechanical measurements can be performed, for example, using stopwatches or micrometer gauges. For instance, layer thicknesses from around 10 µm to 500 µm were measured using a MarCator Digital Indicator 1086 ZR from Mahr. Thin layers to 10 µm can be determined by means of tactile profilometers, as using a Dektak profilometer from Bruker, for example.

The invention accordingly further provides a method of coating a surface of an optoelectronic component wherein a hybrid material according to the invention is applied to the desired surface, dried and optionally cured.

The hybrid material employed according to the invention may be applied to the desired surface by customary methods such as spin coating, blade coating, dip coating and spraying. Commercially available dispensing systems may be used for this purpose, for example.

Prior to application of the polysilazane composition according to the invention, the substrate may optionally be treated with an adherence improver in order to further improve the adherence of the polysilazane composition to the substrate. Typical adherence improvers are based on silanes, such as 3-aminopropyltriethoxysilane, 3-glycidyloxypropyltriethoxysilane, 3-mercaptopropyltrimethoxysilane, vinyltriethoxysilane, 3-methacryloyloxypropyltrimethoxysilane, N-(2-aminoethyl)-3-aminopropyltrimethoxysilane, bis(3-triethoxysilylpropyl)amine, N-(n-butyl)-3-aminopropyltrimethoxysilane and N-(2-aminoethyl)-3-aminopropylmethyldimethoxysilane.

A drying step is carried out after the polysilazane composition has been applied.

Hybrid material comprising a solid organopolysilazane material may be dried by simply allowing it to dry out.

Hybrid material optionally comprising an oily organopolysilazane material is preferably dried by partial condensation reaction with moisture, for example in a conditioning cabinet, optionally in the presence of catalysts for the reaction with atmospheric moisture.

Coatings according to the invention which comprise an alkenyl radical, especially vinyl, on the silicon are curable by chemically crosslinking the layers under the influence of heat, which may be hastened by addition of catalysts that form free radicals (such as organic peroxides or azo compounds for example) or noble metal catalysts (such as Pt or Pd complexes for example) or by irradiation with visible or UV light in the presence of a photoinitiator.

A person skilled in the art will know that some of the —$SiR_2$—NH groups in the organopolysilazane material are transformed into —SiO— groups during the drying step, especially in an oxygen- and/or moisture-containing atmosphere of room air, and also during the operation of the optoelectronic component, where the coating may be exposed to elevated temperatures and oxygen.

In one preferred embodiment of the invention, however, the majority, preferably >80%, more preferably >85% and yet more preferably >90% (as determined by FTIR) of the —$SiR_2$—NH groups are preferred.

The preference of this embodiment is for solid organopolysilazanes, especially those having a high degree of crosslinking and a molar weight greater than 6000 g/mol.

However, preference is also given to a hydrolysis process wherein the organopolysilazane element of the hybrid material is predominantly to fully transformed into an organopolysiloxane.

The conditions for the hydrolysis process to proceed are preferably a relative humidity of ≥50%, more preferably ≥70%, especially ≥75% and a temperature of >50° C., preferably >60° C. and more preferably >75° C.

The hydrolysis can be hastened by addition of bases or noble metal compounds as catalysts, in which case the abovementioned bases and noble metal compounds are suitable.

Preferred candidates for the hydrolysis process are organopolysilazanes that are oily to waxy (i.e. not solids) at room temperature and have a molar weight <6000 g/mol.

Radiative dryers based on IR or NIR technology may be used as well as curing by conventional heating. In such cases, the dryers are typically operated in the wavelength range from 12 to 1.2 micrometers or from 1.2 to 0.8 micrometers. Typical intensities for the radiation range from 5 to 1000 kW/$m^2$.

The invention further provides an optoelectronic component comprising at least one layer formed from the coating according to the invention. A layer of this type consists of the hybrid material according to the invention or a drying and/or curing product thereof.

The hybrid material according to the invention is useful for producing transparent layers having a layer thickness <500 μm for optoelectronic components.

In one preferred embodiment, the refractive index n is in the range from 1.45 to 1.85. The refractive index n is defined as n=c/v, where c is the vacuum speed of light and v is the speed of light in the material whose refractive index is determined. n is determined at 594 nm and 20° C.

Transparent for the purposes of the invention refers to a light transmissivity of ≥99% through a layer thickness of 0.5 mm at a wavelength of 450 nm.

LEDs and displays are preferred as optoelectronic components.

The coating according to the invention is preferable for use as binder material for layers in LEDs which comprise luminophores (phosphors) and/or a converter. Use as an adhesive layer is likewise suitable.

Coatings according to the invention are preferably non-yellowing on exposure to a temperature of up to 250° C. and irradiation with light at a wavelength of ≥400 nm.

The coating according to the invention can be used in a diversity of LED devices, for example high brightness LEDs (HBLEDs), vertical-cavity surface-emitting lasers (VC-SELs), laser diodes, flat screens, projection displays for optical components, injection-mouldable optical lenses and other optical parts, devices and structures. They are further useful as part of photosemiconductor devices equipped with blue or white LED elements. LEDs comprising layers according to the invention may be employed as back lighting for liquid crystal displays, traffic lights, advertising displays, etc.

A typical LED construction as per the invention comprises an LED chip, optionally a leadframe, optionally gold wire, optionally soldering metal, optionally packing material, optionally an encapsulating material and primary and secondary optics.

The coating according to the invention is suitable for example for employment in LEDs as described in U.S. Pat. Nos. 6,274,924 and 6,204,523.

The invention is more particularly elucidated by the examples without being limited thereby.

EXAMPLES

Preparation of Polysilazanes Employed According to the Invention, by Fluoride Ion Catalysed Crosslinking of DURAZANE 1033 and DURAZANE 1800

Example 1

In a 250 ml flask, 50 g of DURAZANE 1033 and 50 g of n-heptane were mixed under nitrogen blanketing and careful exclusion of moisture. At room temperature 0.5 g of tetramethylammonium fluoride was added. The reaction solution was heated to 60° C. over 2 h and stirred at 60° C. until gas evolution ceased (after about 2 h). After cooling down to 0° C., 200 ml of n-heptane were added and precipitated salt was filtered off. The reaction solution was initially concentrated in a rotary evaporator down to a volume of about 100 ml and then filtered again. Thereafter, the reaction solution was concentrated to dryness in the rotary evaporator, leaving 48 g of a colourless viscid oil.

Example 2

In a 250 ml flask, 50 g of DURAZANE 1033 and 50 g of THF were mixed under nitrogen blanketing and careful exclusion of moisture. At 0° C. 0.5 g of tetramethylammonium fluoride was added. Spontaneous evolution of gas was observed. The reaction solution was heated to 40° C. over 4 h and stirred at 40° C. until gas evolution ceased (about 2 h). After cooling down to 0° C., 200 ml of n-heptane were added and precipitated salt was filtered off. The reaction solution was initially concentrated in a rotary evaporator down to a volume of about 100 ml and then filtered again. Thereafter, the reaction solution was concentrated to dryness in the rotary evaporator, leaving 45 g of a colourless glassy solid.

Example 3

In a 250 ml flask, 50 g of DURAZANE 1800 and 50 g of acetonitrile were mixed under nitrogen blanketing and careful exclusion of moisture. At room temperature 0.5 g of caesium fluoride was added. The reaction solution was heated to 60° C. over 2 h and stirred at 60° C. until gas evolution ceased (about 2 h). After cooling down to 0° C., 200 ml of di-n-butyl ether were added and the precipitated salt was filtered off. The reaction solution was initially concentrated in a rotary evaporator down to a volume of about 100 ml and then filtered again. Thereafter, the reaction solution was concentrated to dryness in the rotary evaporator, leaving 47 g of a colourless to slightly pale yellow glassy solid.

Example 4

In a 250 ml flask, 50 g of DURAZANE 1800 and 50 g of THF were mixed under nitrogen blanketing and careful exclusion of moisture. At 0° C. 0.5 g of tetraethylammonium fluoride was added. Spontaneous evolution of gas was observed. The reaction solution was heated to 20° C. over 2 h and stirred at 20° C. until gas evolution ceased (about 4 h). After cooling down to 0° C., 200 ml of n-heptane were added and precipitated salt was filtered off. The reaction solution was initially concentrated in a rotary evaporator down to a volume of about 100 ml and then filtered again. Thereafter, the reaction solution was concentrated to dryness in the rotary evaporator, leaving 46 g of a colourless glassy solid.

TABLE 1

Summary of examples

| Example | Raw material | Solvent | Catalyst | Temperature | Molar weight* | Consistency | η [mPas] |
|---|---|---|---|---|---|---|---|
| 1st | DURAZANE 1033 | n-heptane | NMe$_4$F | 60° C. | 5200 | liquid/oil | ca. 5000 |
| 2nd | DURAZANE 1033 | THF | NMe$_4$F | 40° C. | 10300 | solid | — |
| 3rd | DURAZANE 1800 | acetonitrile | CsF | 60° C. | 12700 | solid | — |

TABLE 1-continued

Summary of examples

| Example | Raw material | Solvent | Catalyst | Temperature | Molar weight* | Consistency | η [mPas] |
|---|---|---|---|---|---|---|---|
| 4th | DURAZANE 1800 | THF | NEt$_4$F | 20° C. | 13900 | solid | — |
| DURAZANE 1033 | — | — | — | — | 2500 | liquid | 19 |
| DURAZANE 1800 | — | — | — | — | 2800 | liquid | 80 |

*the molar weight was determined by GPC (gel permeation chromatography) against polystyrene standards Comparison of Example 1 with Example 2 shows that the extent of the crosslinking reaction can be intentionally controlled via the choice of reagents. A deliberately low degree of crosslinking provides a product of medium molar weight and liquid, viscid to oily consistency (Ex. 1st), while a high degree of crosslinking provides a product that is obtained in the form of a solid (Ex. 2nd).

DURAZANE 1033 and the crosslinked product of Ex. 2nd were subjected to a thermogravimetric analysis (TGA: loss of weight on heating). DURAZANE 1800 and the crosslinked product of Ex. 3rd were likewise subjected to the recording of a TGA.

Comparing the low molecular weight starting materials with the corresponding crosslinked products shows a distinct decrease in the vaporizable fractions of the crosslinked products.

Comparing the GPC spectra of DURAZANE 1033, DURAZANE 1800 and the corresponding crosslinked-solid products of Example 2 and Example 3 is clear in showing the higher molar weight coupled with the reduced fraction of oligomers.

A solution of DURAZANE 1033 in dibutyl ether and a dibutyl ether solution of the crosslinked product of Example 2 were used to spin coat a 3 inch wafer with a layer 1.0 μm in thickness. The wafer was then baked on a hotplate at 200° C. for 1 hour. After cooling down to room temperature, a Dektak profilometer (mechanical layer-thickness measuring instrument) was used to measure the variation in layer thickness across the wafer. The same comparison was carried out with DURAZANE 1800 and the crosslinked product of Example 3.

A comparison of the low molecular weight starting materials with the corresponding crosslinked products shows a distinct reduced variation in layer thickness for the wafers coated with crosslinked products. This result suggests that the products crosslinked according to the invention have significantly improved coating properties.

The invention claimed is:

1. A method of applying a transparent layer having a thickness of <500 μm in an optoelectronic component, wherein
I) a hybrid material comprising
a) an organopolysilazane material comprising repeat units of formula (I)

—[SiRR'—NH]    (I)

where
R and R' are the same or different and are each H, methyl, ethyl, straight-chain or branched C3-C8 alkyl, C3-C8 cycloalkyl, C2-C6 alkenyl or aryl
with the proviso that R and R' may not both be H; and
b) at least one surface-modified nanoscale inorganic oxide is applied to a surface in the optoelectronic component,
II) is dried, and
III) is optionally cured,
and wherein at least 20% of the repeat units of formula (I) have at least one intramolecular crosslink.

2. The method as claimed in claim 1, wherein in formula (I)
R and R' are the same or different and are each H, methyl, ethyl, straight-chain, branched or cyclic C$_3$-C$_8$alkyl, phenyl, vinyl or aryl.

3. The method as claimed in claim 2, wherein in formula (I)
R and R' are the same or different and are each H, methyl, ethyl, n-propyl, isopropyl, n-butyl, isobutyl, phenyl or vinyl.

4. The method as claimed in claim 3, wherein in formula (I) R and R' are the same or different and are each H, methyl or vinyl.

5. The method as claimed in claim 1, wherein organopolysilazanes used were crosslinked by the catalytic action of fluoride ions.

6. The method as claimed in claim 1, wherein component b) of the hybrid material consists of one or more types of inorganic oxidic nanoparticles having an average diameter in the range from 1 to 30 nm.

7. The method as claimed in claim 6, wherein the nanoparticles are selected from the group consisting of Al$_2$O$_3$, SiO$_2$, ZrO$_2$ and TiO$_2$.

8. The method as claimed in claim 1, wherein the nanoparticles are surface modified with alkoxysilanes of formula (V)

$$R''_n Si(OR''')_m \quad (V)$$

where
n is 1, 2 or 3 and m is 4−n;
R" is methyl, ethyl, linear, branched or cyclic alkyl, of 3-8 carbon atoms, phenyl, C$_2$-C$_6$ alkenyl; and
R'" is methyl, ethyl, n-propyl, isopropyl, n-butyl or isobutyl.

9. The method as claimed in claim 8, wherein in formula (V) n is 1 or 3 and m is 4−n;
R" is methyl, ethyl, linear or branched C$_3$-C$_8$ alkyl, phenyl or vinyl; and
R'" is methyl or ethyl.

10. The method as claimed in claim 9, wherein in formula (V)
n is 1 or 3 and m is 4−n;
R" is methyl, ethyl or linear or branched C$_3$-C$_8$ alkyl; and
R'" is methyl or ethyl.

11. The method as claimed in claim 1, wherein the amount of inorganic nanoparticles in the hybrid material is in the range from 1 to 85 wt %.

12. The method as claimed in claim 1, wherein the optoelectronic component is an LED or a display.

13. The method as claimed in claim 12, wherein the optoelectronic component is an LED and the coating comprises luminophores and/or converters.

14. The method as claimed in claim 1, wherein the hybrid material
is obtained by provision of one or more organopolysilazanes of formula (I), crosslinking of the polysilazanes of formula (I) by treatment with a fluoride catalyst, and mixing with the surface-modified nanoscale inorganic oxide.

15. The method as claimed in claim 1, wherein in step III) the organopolysilazane material is partially or completely converted into an organopolysiloxane by hydrolysis at temperatures >150° C.

16. The method as claimed in claim 1, wherein step III) is carried out at a temperature >50° C.

17. An optoelectronic component comprising one or more layers obtained from a hybrid material as described in claim 1.

18. The method as claimed in claim 1, wherein step III) is carried out at a temperature >60° C. and at a relative humidity of ≥70% and the nanoparticles are $TiO_2$ or $ZrO_2$.

19. The method as claimed in claim 1, wherein component b) of the hybrid material consists of one or more types of inorganic oxidic nanoparticles having an average diameter in the range from 3 to 20 nm.

* * * * *